(12) United States Patent
Amai

(10) Patent No.: US 11,935,766 B2
(45) Date of Patent: Mar. 19, 2024

(54) LIQUID PROCESSING APPARATUS AND LIQUID PROCESSING METHOD

(71) Applicant: Tokyo Electron Limited, Tokyo (JP)

(72) Inventor: Masaru Amai, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 771 days.

(21) Appl. No.: 16/977,546

(22) PCT Filed: Feb. 20, 2019

(86) PCT No.: PCT/JP2019/006240
§ 371 (c)(1),
(2) Date: Sep. 2, 2020

(87) PCT Pub. No.: WO2019/171949
PCT Pub. Date: Sep. 12, 2019

(65) Prior Publication Data
US 2021/0005481 A1    Jan. 7, 2021

(30) Foreign Application Priority Data
Mar. 6, 2018 (JP) .................... 2018-039883

(51) Int. Cl.
*H01L 21/67* (2006.01)
*B08B 3/10* (2006.01)

(52) U.S. Cl.
CPC ......... *H01L 21/67103* (2013.01); *B08B 3/10* (2013.01); *H01L 21/67023* (2013.01); *H01L 21/67248* (2013.01)

(58) Field of Classification Search
CPC ............ H01L 21/67098–67115; H01L 21/67017–67086; H01L 21/02041–02101; H01L 21/00–86
See application file for complete search history.

(56) References Cited

U.S. PATENT DOCUMENTS

2017/0229331 A1* 8/2017 Nosrati ............ H01L 21/67103
2019/0198363 A1* 6/2019 Shimai ............. H01L 21/67051

FOREIGN PATENT DOCUMENTS

| JP | 2005-267863 A | 9/2005 |
| JP | 2005267863 | * 9/2005 |
| JP | 2007-335709 A | 12/2007 |
| JP | 2007335709 | * 12/2007 |
| JP | 2007335709 A | * 12/2007 |
| JP | 2008-276974 A | 11/2008 |

(Continued)

OTHER PUBLICATIONS

International Search Report for PCT/JP2019/006240 dated Apr. 23, 2019.

*Primary Examiner* — Mikhail Kornakov
*Assistant Examiner* — Richard Z. Zhang
(74) *Attorney, Agent, or Firm* — Pearne & Gordon LLP

(57) ABSTRACT

A liquid processing apparatus includes a heating member, a substrate holder, a processing liquid supply and a coil. The heating member is disposed adjacent to a portion of a substrate and has an insulating member. The substrate holder is configured to hold the substrate. The processing liquid supply is configured to supply a processing liquid onto the substrate held by the substrate holder. The coil is configured to heat the heating member inductively to heat the portion of the substrate.

9 Claims, 10 Drawing Sheets

(56) References Cited

FOREIGN PATENT DOCUMENTS

| | | | |
|---|---|---|---|
| JP | 2009-238375 A | | 10/2009 |
| JP | 2009238375 | * | 10/2009 |
| JP | 2011-228524 A | | 11/2011 |
| JP | 2015-154063 A | | 8/2015 |
| JP | 2015-192067 A | | 11/2015 |
| JP | 2016-167568 A | | 9/2016 |
| JP | 2017-112364 A | | 6/2017 |

* cited by examiner

LIQUID PROCESSING APPARATUS AND LIQUID PROCESSING METHOD

CROSS-REFERENCE TO RELATED APPLICATION

This Application is a U.S. national phase application under 35 U.S.C. § 371 of PCT Application No. PCT/JP2019/006240 filed on Feb. 20, 2019, which claims the benefit of Japanese Patent Application No. 2018-039883 filed on Mar. 6, 2018, the entire disclosures of which are incorporated herein by reference.

TECHNICAL FIELD

The various aspects and embodiments described herein pertain generally to a liquid processing apparatus and a liquid processing method.

BACKGROUND

Conventionally, there is known a liquid processing apparatus configured to process a semiconductor wafer (hereinafter, simply referred to as "wafer") as a substrate with various kinds of processing liquids. In this liquid processing apparatus, by performing a liquid processing on the wafer while controlling the wafer to be of a high temperature, processing efficiency can be improved (see, for example, Patent Document 1).

PRIOR ART DOCUMENT

Patent Document 1: Japanese Patent Laid-open Publication No. 2017-112364

SUMMARY

In an exemplary embodiment, a liquid processing apparatus includes a heating member, a substrate holder, a processing liquid supply and a coil. The heating member is disposed adjacent to a portion of a substrate and has an insulating member. The substrate holder is configured to hold the substrate. The processing liquid supply is configured to supply a processing liquid onto the substrate held by the substrate holder. The coil is configured to heat the heating member inductively to heat the portion of the substrate.

DETAILED DESCRIPTION

Hereinafter, various exemplary embodiments of a liquid processing apparatus and a liquid processing method according to the present disclosure will be described in detail. However, it should be noted that the present disclosure is not limited to the following exemplary embodiments.

<Outline of Substrate Processing System>

Figure 1:
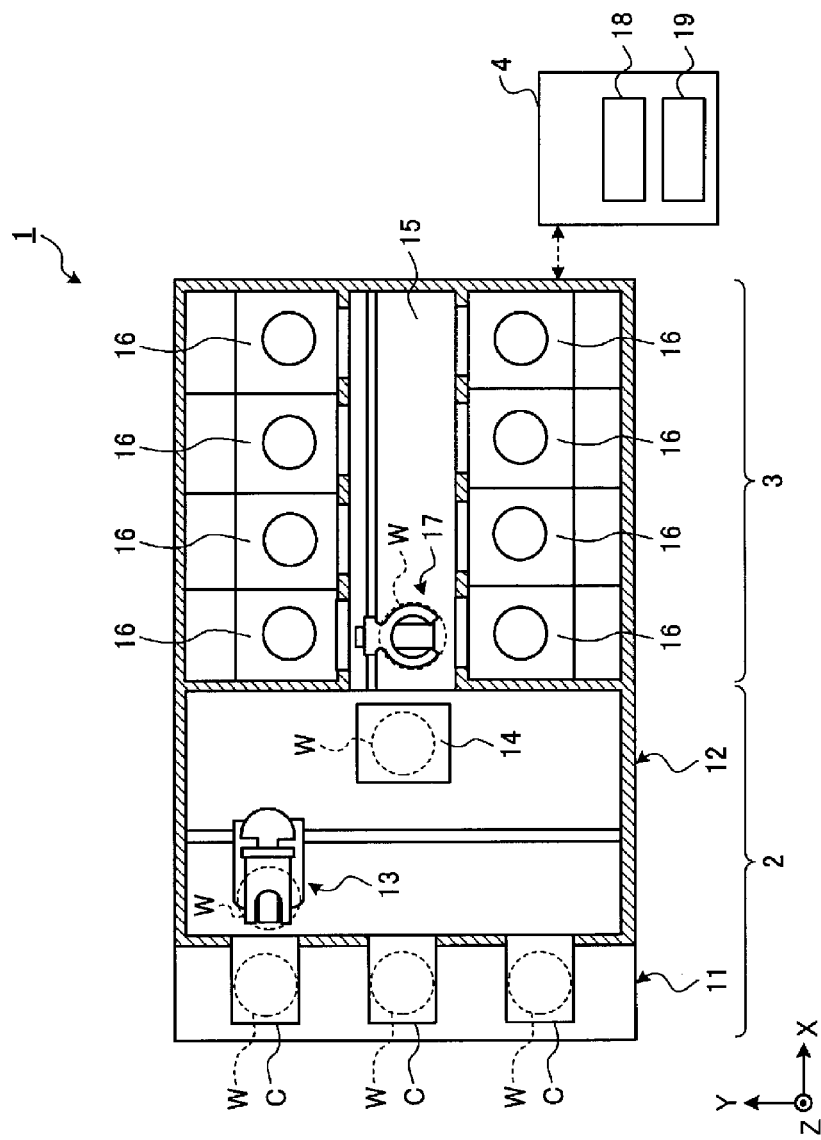
FIG. 1 is a schematic diagram illustrating a schematic configuration of a substrate processing system according to a first exemplary embodiment.

Referring to FIG. 1, a schematic configuration of a substrate processing system 1 according to a first exemplary embodiment will be explained. FIG. 1 is a diagram illustrating the schematic configuration of the substrate processing system 1 according to the first exemplary embodiment. In the following, in order to clarify positional relationships, the X-axis, Y-axis and Z-axis which are orthogonal to each other will be defined, and the positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the first exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of liquid processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the liquid processing units 16 by using the wafer holding mechanism.

The liquid processing units 16 perform a predetermined liquid processing on the wafers W transferred by the substrate transfer device 17. Details of the liquid processing unit 16 will be elaborated later.

Further, the substrate processing system 1 is provided with a control device 4. The control device 4 is, for example, a computer, and includes a controller 18 and a storage 19. The storage 19 stores a program that controls various processings performed in the substrate processing system 1. The controller 18 controls the operations of the substrate processing system 1 by reading and executing the program stored in the storage 19.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a liquid processing unit 16.

The wafer W carried into the liquid processing unit 16 is processed by the liquid processing unit 16, and then, carried out from the liquid processing unit 16 and placed on the delivery unit 14 by the substrate transfer device 17. The processed wafer W placed on the delivery unit 14 is then returned to the carrier C of the carrier placing section 11 by the substrate transfer device 13.

<Outline of Liquid Processing Unit>

Figure 2:
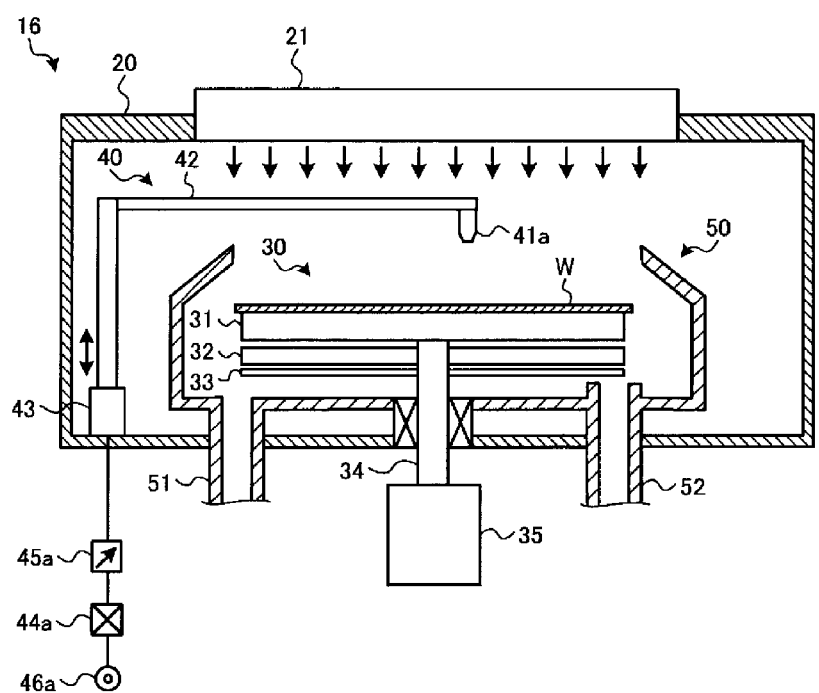
FIG. 2 is a schematic diagram illustrating a configuration of a liquid processing unit.

Now, an outline of the liquid processing unit 16 will be described with reference to FIG. 2. FIG. 2 is a schematic diagram illustrating a configuration of the liquid processing unit 16. As depicted in FIG. 2, the liquid processing unit 16 includes a processing chamber 20, a substrate holding mechanism 30, a processing liquid supply 40, and a recovery cup 50.

The processing chamber 20 accommodates therein the substrate holding mechanism 30, the processing liquid supply 40, and the recovery cup 50. A FFU (Fan Filter Unit) 21 is provided at a ceiling of the chamber 20. The FFU 21 creates a downflow of a clean gas which is supplied into the processing chamber 20. Further, the FFU 21 is not essential, so the FFU 21 may not be provided within the processing chamber 20.

The substrate holding mechanism 30 is equipped with a substrate holder 31, a coil unit 32, a shield member 33, a shaft 34 and a driver 35. The substrate holder 31 supports the wafer W horizontally. The coil unit 32 is provided adjacent to the substrate holder 31. The shield member 33 is disposed at an opposite side from the substrate holder 31 with the coil unit 32 therebetween. Details of the substrate holder 31, the coil unit 32 and the shield member 33 will be elaborated later.

The shaft 34 is a vertically extending member. A base end of the shaft 34 is rotatably supported by the driver 35, and the shaft 34 supports the substrate holder 31 horizontally at a leading end thereof. The driver 35 is configured to rotate the shaft 34 around a vertical axis.

In the substrate holding mechanism 30 having the above-described configuration, by rotating the shaft 34 with the driver 35, the substrate holder 31 supported by the shaft 34 is rotated, so that the wafer W held by the substrate holder 31 is rotated.

The processing liquid supply 40 is configured to supply a processing fluid onto the wafer W held by the substrate holder 31. The processing liquid supply 40 is equipped with a nozzle 41a, an arm 42 configured to support the nozzle 41a horizontally, and a rotating/elevating mechanism 43 configured to rotate and move the arm 42 up and down.

The nozzle 41a is connected to a processing liquid source 46a via a valve 44a and a flow rate controller 45a. The processing liquid source 46a stores therein a preset processing liquid for processing the wafer W. Further, though FIG. 2 illustrates an example where a single set of the nozzle, the processing liquid source and the like is provided in the processing liquid supply 40, the processing liquid supply 40 may be equipped with multiple sets of the nozzle, the processing liquid source, and the like.

The recovery cup 50 is disposed to surround the substrate holder 31, and is configured to collect the processing liquid scattered from the wafer W when the substrate holder 31 is rotated. A drain port 51 is formed at a bottom of the recovery cup 50, and the processing liquid collected by the recovery cup 50 is drained from the drain port 51 to the outside of the liquid processing unit 16. Further, an exhaust port 52 is formed at the bottom of the recovery cup 50 to exhaust the clean gas supplied from the FFU 21 to the outside of the processing unit 16.

<Configuration of Substrate Holding Mechanism (First Exemplary Embodiment)>

Figure 3A:
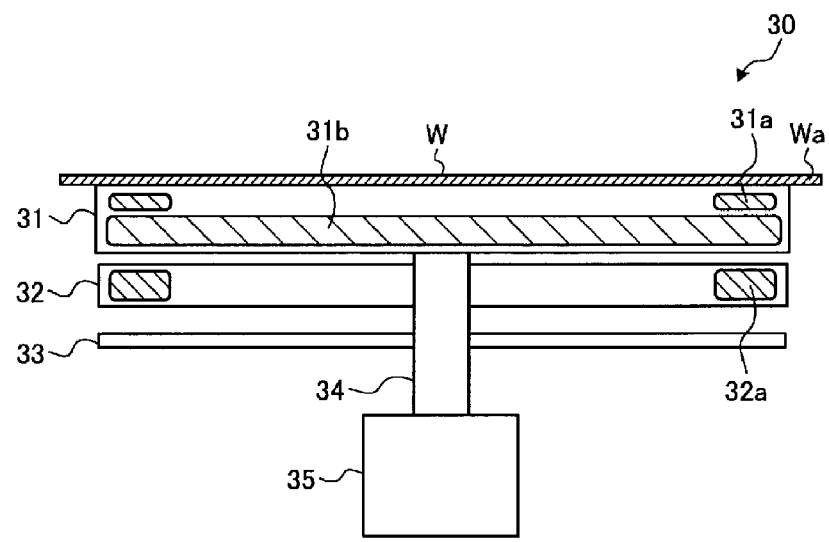
FIG. 3A is a cross sectional view illustrating a configuration of a substrate holding device according to the first exemplary embodiment.
Figure 3B:
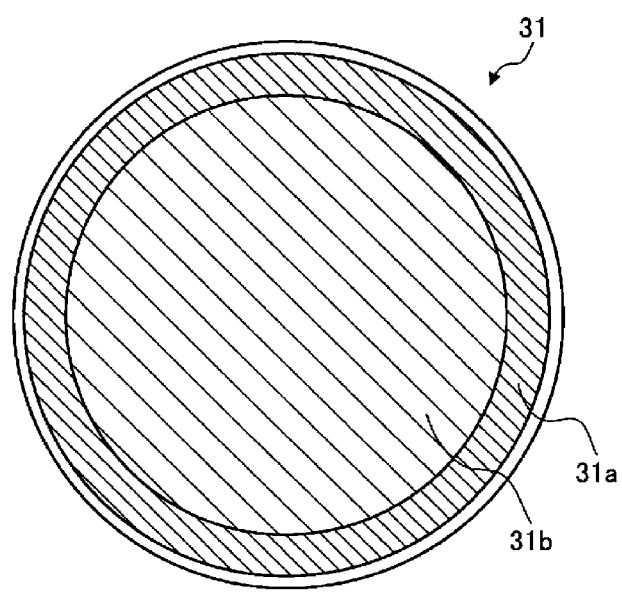
FIG. 3B is a top view illustrating a configuration of a heating member according to the first exemplary embodiment.

Now, a specific configuration of the substrate holding mechanism 30 in the first exemplary embodiment will be explained with reference to FIG. 3A to FIG. 3C. FIG. 3A is a cross sectional view illustrating the configuration of the substrate holding mechanism 30 according to the first exemplary embodiment; FIG. 3B, a top view illustrating a configuration of a heating member 31a according to the first exemplary embodiment; and FIG. 3C, a top view illustrating a configuration of the coil unit 32 according to the first exemplary embodiment.

The substrate holder 31 is of a substantially circular plate shape, and a non-illustrated suction opening for suctioning the wafer W is provided in a top surface of the substrate holder 31. The substrate holder 31 is capable of holding the wafer W on the top surface thereof through suctioning from the suction opening.

The substrate holder 31 has therein a heating member 31a and an insulating member 31b. The heating member 31a is implemented by a member inductively heated by a magnetic flux generated by a coil 32a of the coil unit 32. The heating member 31a may be made of, for example, graphite. However, the material of the heating member 31a is not limited to the graphite, and the heating member 31a may be formed of a material other than the graphite.

As depicted in FIG. 3B, the heating member 31a has a circular ring shape having an outer diameter slightly smaller than a diameter of the top surface of the substrate holder 31. As shown in FIG. 3A, the heating member 31a is adjacent to a part of the wafer W, that is, a certain portion of the wafer W. By way of example, in the first exemplary embodiment, the heating member 31a is adjacent to a bevel portion Wa of the wafer W.

The insulating member 31b is of a circular plate shape having a diameter substantially equal to the outer diameter of the heating member 31a, and is made of a material having low thermal conductivity. The insulating member 31b is made of, by way of non-limiting example, a synthetic resin or ceramic. However, the material of the insulating member 31b is not limited to the synthetic resin or ceramic, and the insulating member 31b may be made of a material other than the synthetic resin or ceramic.

As stated above, the heating member 31a is provided adjacent to the certain portion of the wafer W, and the insulating member 31b is provided adjacent to this heating member 31a. Accordingly, heat generated by the heating member 31a due to the magnetic flux generated by the coil 32a can be suppressed from leaking to a portion other than the certain portion of the adjacent wafer W. Thus, according to the first exemplary embodiment, a temperature of the certain portion (the bevel portion Wa in the first exemplary embodiment) of the wafer W can be controlled individually when the wafer W is liquid-processed.

In the first exemplary embodiment, when a liquid processing (for example, a cleaning processing) is performed on, for example, the bevel portion Wa of the wafer W, the liquid processing upon the bevel portion Wa can be carried out efficiently and stably by controlling the bevel portion Wa to be of a high temperature by inductively heating the heating member 31a.

Further, though the first exemplary embodiment is described for the example where the heating member 31a is disposed adjacent to the bevel portion Wa of the wafer W, a position to which the heating member 31a is provided adjacent is not limited to the bevel portion Wa of the wafer W and may be any position such as a central portion of the wafer W, a portion between the central portion and the bevel portion Wa of the wafer W, or the like.

Furthermore, in the first exemplary embodiment, the insulating member 31b needs to be disposed at an opposite side from the wafer W with the heating member 31a therebetween. By way of example, if the wafer W is held on the top surface of the substrate holder 31, the heating member 31a needs to be placed in an upper portion of the substrate holder 31, whereas the insulating member 31b needs to be placed in a lower portion of the substrate holder 31.

With this configuration, the leak of the heat from the heating member 31a to a side (that is, a lower side) opposite from the wafer W can be suppressed. Therefore, according to the first exemplary embodiment, a certain portion of the wafer W can be heated efficiently when the wafer W is liquid-processed.

In addition, in the first exemplary embodiment, the substrate holder 31 needs to hold the wafer W such that the wafer W is in direct contact with the substrate holder 31. Accordingly, the heat emitted by the heating member 31a of the substrate holder 31 can be transferred to the wafer W directly without passing through air or the like. Therefore, according to the first exemplary embodiment, the wafer W can be heated more efficiently when the wafer W is liquid-processed.

Moreover, though the first exemplary embodiment is described for the example where the substrate holder 31 holds the wafer W such that the substrate holder 31 is in direct contact with the wafer W, the substrate holder 31 may not necessarily hold the wafer W in direct contact with it.

For example, the substrate holder 31 may hold the wafer W such that the wafer W is close to the top surface of the substrate holder 31 (for example, a gap therebetween may be equal to or less than 0.5 mm) to the extent that the heat is transferred to the wafer W even if air exists therebetween.

Additionally, in the first exemplary embodiment, it is desirable that the surface of the substrate holder 31 is treated with a corrosion-resistant coating. In this case, when the wafer W is processed with a corrosive processing liquid, corrosion of the heating member 31a or the insulating member 31b within the substrate holder 31 can be suppressed.

Parts of the substrate holding mechanism 30 other than those described above will also be explained. The coil unit 32 has the coil 32a and is disposed adjacent to the substrate holder 31. By way of example, the coil unit 32 is placed adjacent to the lower side of the substrate holder 31.

Further, the coil unit 32 is supported by a non-illustrated supporting member of the substrate holding mechanism 30 and is not rotated along with the substrate holder 31.

The coil 32a of the coil unit 32 generates the magnetic flux to the heating member 31a of the adjacent substrate holder 31. Accordingly, in the first exemplary embodiment, it is possible to inductively heat the heating member 31a of the substrate holder 31 which is rotated along with the wafer W thereon.

Figure 3C:
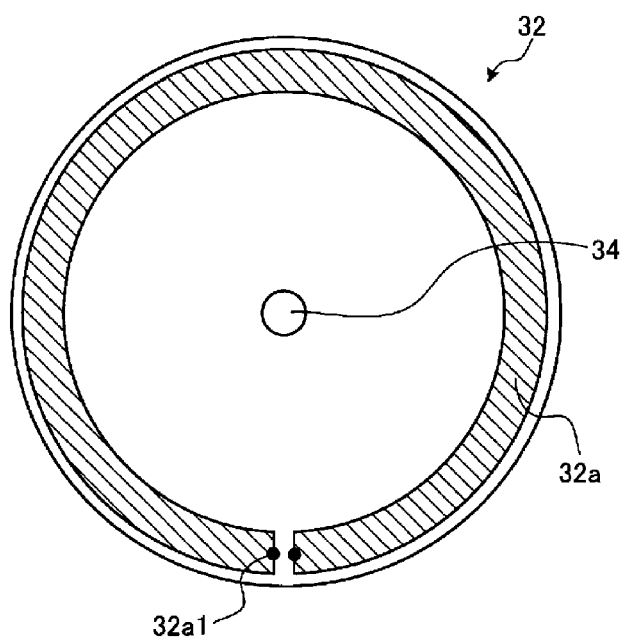
FIG. 3C is a top view illustrating a configuration of a coil unit according to the first exemplary embodiment.

Furthermore, as depicted in FIG. 3A to FIG. 3C, the coil 32a is of a circular arc shape having an inner diameter and an outer diameter substantially equal to those of the heating member 31a, and includes a pair of electrodes 32a1. A power can be fed to the coil 32a from the pair of electrodes 32a1.

The coil 32a includes a multiple number of coils, each of which has a winding axis oriented toward the heating member 31a, arranged along this circular arc-shape region. By way of example, in the first exemplary embodiment, the winding axis of the coil 32a needs to extend in a vertical direction. With this configuration, the coil 32a is capable of generating the magnetic flux to the heating member 31a efficiently.

The shield member 33 shown in FIG. 3A shields the magnetic flux generated by the coil 32a. The shield member 33 is disposed at a position near the coil 32a other than a position between the substrate holder 31 and the coil 32a. By way of example, the shield member 33 is disposed under the coil 32a (that is, an opposite side of the winding axis of the coil 32a).

With this configuration, interference of the magnetic flux generated by the coil 32a with another device within the liquid processing unit 16 can be suppressed. Thus, according to the first exemplary embodiment, the wafer W can be further stably heated when the wafer W is liquid-processed. Furthermore, the shield member 33 may or may not be configured to be rotated along with the substrate holder 31.

<Configuration of Substrate Holding Mechanism (Second Exemplary Embodiment)>

Figure 4A:
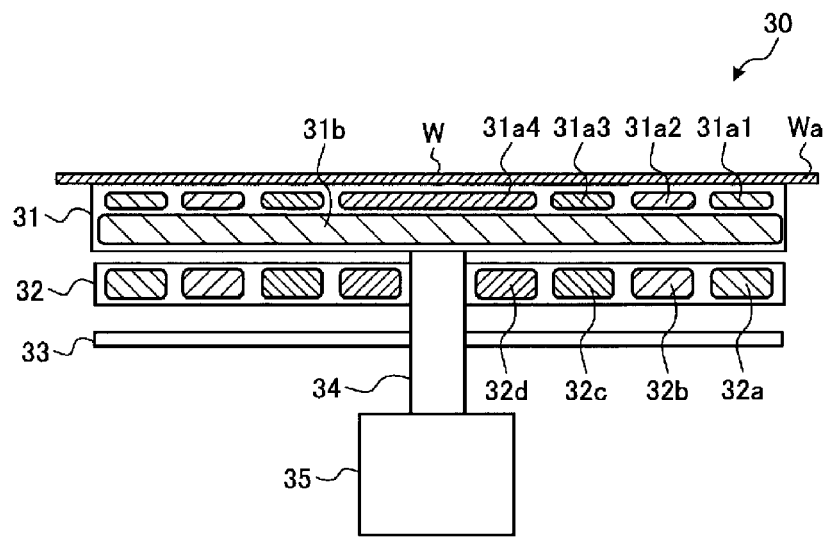
FIG. 4A is a cross sectional view illustrating a configuration of a substrate holding mechanism according to a second exemplary embodiment.
Figure 4B:
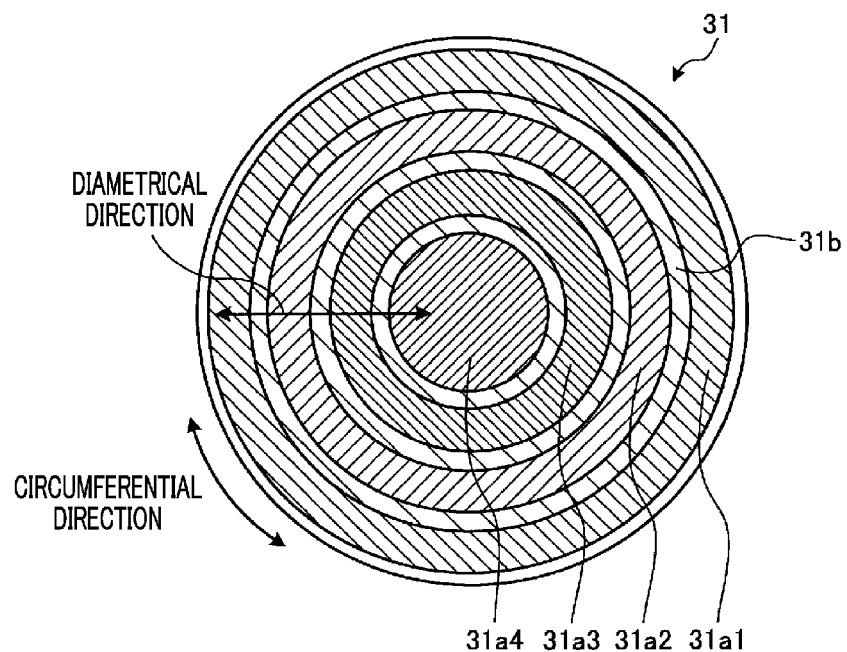
FIG. 4B is a top view illustrating a configuration of a heating member according to the second exemplary embodiment.

Now, a specific configuration of a substrate holding mechanism 30 according to a second exemplary embodiment will be described with reference to FIG. 4A to FIG. 4C. FIG. 4A is a cross sectional view illustrating a configuration of the substrate holding mechanism 30 according to the second exemplary embodiment; FIG. 4B, a top view illustrating a configuration of heating members 31a1 to 31a4 according to the second exemplary embodiment; and FIG. 4C, a top view illustrating a configuration of the coil unit 32 according to the second exemplary embodiment.

As shown in FIG. 4A, the substrate holding mechanism 30 of the second exemplary embodiment includes the multiple heating members 31a1 to 31a4 and multiple coils 32a to 32d. The heating members 31a1 to 31a4 are arranged on a same plane to be adjacent to different portions of the wafer W.

By way of example, in the second exemplary embodiment, the heating member 31a1 is disposed adjacent to the bevel portion Wa of the wafer W, and the heating member 31a4 is disposed adjacent to the central portion of the wafer W. The heating member 31a2 and the heating member 31a3 are provided between these heating members 31a1 and 31a4. Further, as depicted in FIG. 4B, each of the heating members 31a1 to 31a3 has a circular ring shape, and the heating member 31a4 has a circular plate shape.

The multiple coils 32a to 32d provided in the coli unit 32 are configured to inductively heat the heating members 31a1 to 31a4, and disposed adjacent to the heating members 31a1 to 31a4, respectively, as illustrated in FIG. 4A.

Figure 4C:
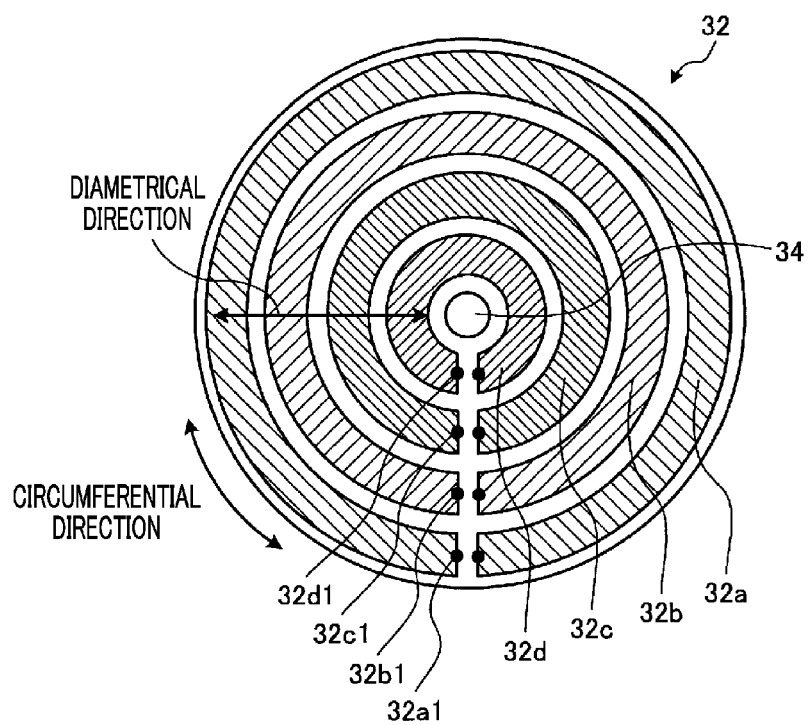
FIG. 4C is a top view illustrating a configuration of a coil unit according to the second exemplary embodiment.

As depicted in FIG. 4A to FIG. 4C, the coil 32a (32b, 32c) is formed to have a circular arc shape having an inner diameter and an outer diameter substantially equal to those of the heating members 31a1 (31a2, 31a3), and the coil 32d is formed to have a circular arc shape having an outer diameter substantially equal to a diameter of the heating member 31a4. Further, the coil 32a (32b, 32c, 32d) has a pair of electrodes 32a1 (32b1, 32c1, 32d1).

In the second exemplary embodiment, by supplying a power to the multiple coils 32a to 32d via these pairs of electrodes 32a1 to 32d1 individually, multiple portions of the wafer W can be heated individually. Thus, according to the second exemplary embodiment, when a processing ability of the processing liquid is different at the multiple portions of the wafer W, the processing ability of the processing liquid can be made uniform within the surface of the wafer W. Here, the term "processing ability" refers to a power of an action of the processing liquid upon the wafer W itself or a film formed on the wafer W in the processing of the wafer W. By way of example, this processing ability includes an etching rate, a cleaning power, a growth rate of a coating film, and so forth. Further, the processing ability of the processing liquid within the surface of the wafer W can be varied at different portions of the wafer W.

As shown in FIG. 4A and FIG. 4B, in the second exemplary embodiment, the heating members 31a1 to 31a4 need to be extended along a circumferential direction of the wafer W at the positions facing the wafer W, and need to be arranged in a diametrical direction of the wafer W.

Further, in the second exemplary embodiment, the coils 32a to 32d need to be extended along the circumferential direction of the wafer W at the positions facing the wafer W, and need to be arranged in the diametrical direction of the wafer W. That is, in the second exemplary embodiment, the heating members 31a1 to 31a4 and the coils 32a to 32d need to be arranged in arc shapes on concentric circles having different diameters.

Here, in a liquid processing performed while rotating the wafer W, the processing ability may be different in the circumferential direction of the wafer W. By arranging the heating members 31a1 to 31a4 and the coils 32a to 32d as stated above, however, the processing ability of the processing liquid which is different in the circumferential direction can be uniformed within the surface of the wafer W. Further, the processing ability of the processing liquid within the surface of the wafer W may be varied depending on a portion of the wafer W involved.

Modification Examples

Figure 5:
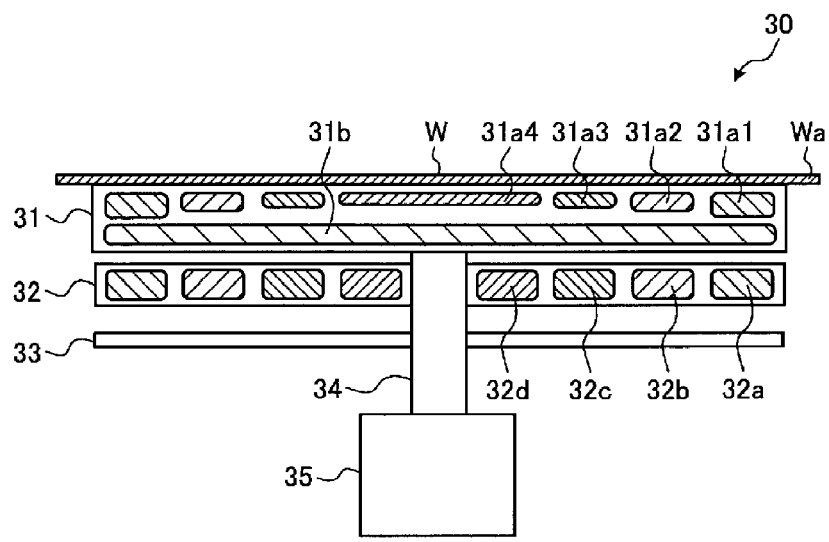
FIG. 5 is a cross sectional view illustrating a configuration of a substrate holding mechanism according to a first modification example of the second exemplary embodiment.

Now, various modification examples of the above-described second exemplary embodiment will be described. FIG. 5 is a cross sectional view illustrating a configuration of a substrate holding mechanism 30 according to a first modification example of the second exemplary embodiment. As shown in FIG. 5, in the first modification example, the heating members 31a1 to 31a4 have different thicknesses. By way of example, the heating members 31a1 to 31a4 of the first modification example may be formed such that the heating member 31a1 at the outermost position is the thickest and the heating member 31a4 at the innermost position is thinnest. That is, the thicknesses of the heating members 31a1 to 31a4 decrease gradually as they are located at inner positions.

As stated above, by setting differences between the thicknesses of the heating members 31a1 to 31a4, the wafer W can be heated while further raising the temperature of the thicker heating member (for example, the heating member 31a1). Therefore, according to the first modification example, the processing ability of the processing liquid can be made uniform within the surface of the wafer W when the processing ability of the processing liquid is different at multiple positions of the wafer W. Furthermore, the processing ability of the processing liquid within the surface of the wafer W may varied at the different portions of the wafer W.

Moreover, though the heating member 31a1 is the thickest in the first modification example, the thickest heating member is not limited to the heating member 31a1, and any heating member adjacent to a portion of the wafer W where the processing ability of the processing liquid is low may be set to have a large thickness.

Figure 6:
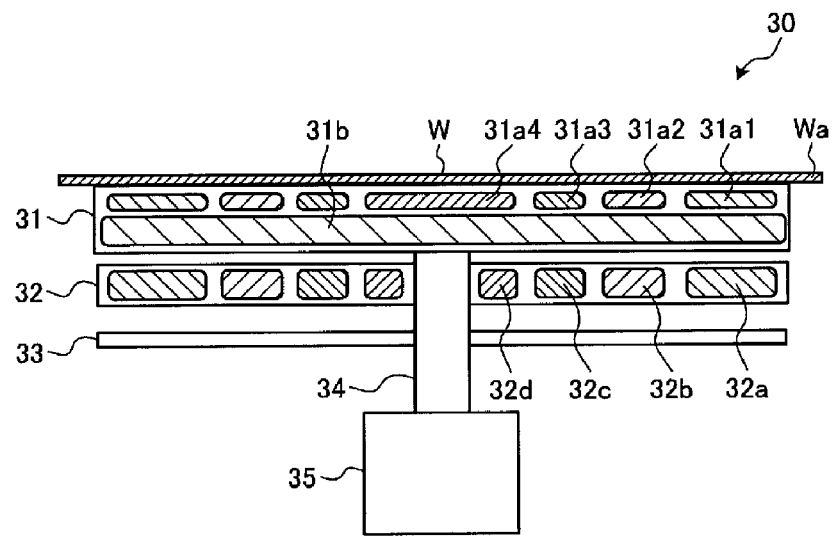
FIG. 6 is a cross sectional view illustrating a configuration of a substrate holding mechanism according to a second modification example of the second exemplary embodiment.

FIG. 6 is a cross sectional view illustrating a configuration of a substrate holding mechanism 30 according to a second modification example of the second exemplary embodiment. As depicted in FIG. 6, in the second modification example, the heating members 31a1 to 31a4 and the coils 32a to 32d respectively corresponding thereto have different widths. By way of example, among the heating members 31a1 to 31a4 and the corresponding coils 32a to 32d of the second modification example, the heating member 31a1 and the coil 32a at the outermost position are set to have a large width.

As stated above, by designing the heating members 31a1 to 31a4 to have differences in their widths and the coils 32a to 32d to have differences in their widths, the processing ability of the processing liquid can be made uniform within the surface of the wafer W to be suitable for a processing ability distribution of the wafer W which differs greatly depending on the liquid processing involved. Further, though the second modification example has been described for the example where the heating member 31a1 has the larger width, the heating member which is set to have the larger width is not limited thereto.

Figure 7:
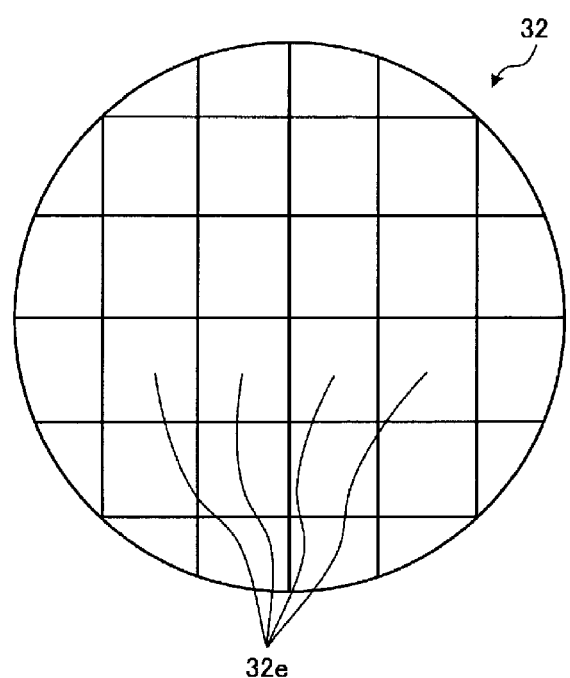
FIG. 7 is a top view illustrating a configuration of a coil unit according to a third modification example of the second exemplary embodiment.

FIG. 7 is a top view illustrating a configuration of a coil unit 32 according to a third modification example of the second exemplary embodiment. As depicted in FIG. 7, coils of the coil unit 32 are arranged separately in the third modification example. By way of example, the coil unit 32 of the third modification example has different sections and is equipped with a multiple number of coils 32e which are arranged on the wafer W in a substantially checkerboard shape.

As stated above, the coils of the coil unit 32 are separated into the checkerboard shape and thus capable of heating different portions of the wafer W to individual temperatures.

Thus, according to the third modification example, when the processing ability of the processing liquid is different at the different portions of the wafer W, this processing ability of the processing liquid can be made uniformed within the surface of the wafer W. Appropriately, the third modification example is applied to a processing in which the substrate is not rotated.

Figure 8A:
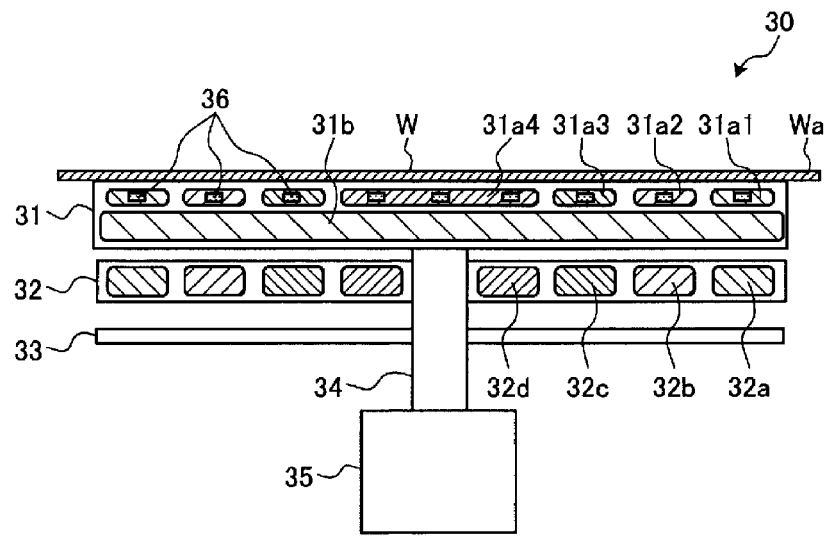
FIG. 8A is a cross sectional view illustrating a configuration of a substrate holding mechanism according to a fourth modification example of the second exemplary embodiment.

FIG. 8A is a cross sectional view illustrating a configuration of a substrate holding mechanism 30 according to a fourth modification example of the second exemplary embodiment. As depicted in FIG. 8A, in the fourth modification example, the substrate holder 31 is equipped with wireless temperature sensors 36. Each wireless temperature sensor 36 has a function of transmitting temperature information within the substrate holder 31 wirelessly. By way of example, the multiple wireless temperature sensors 36 are provided within the heating members 31a1 to 31a4 of the substrate holder 31.

Figure 8B:
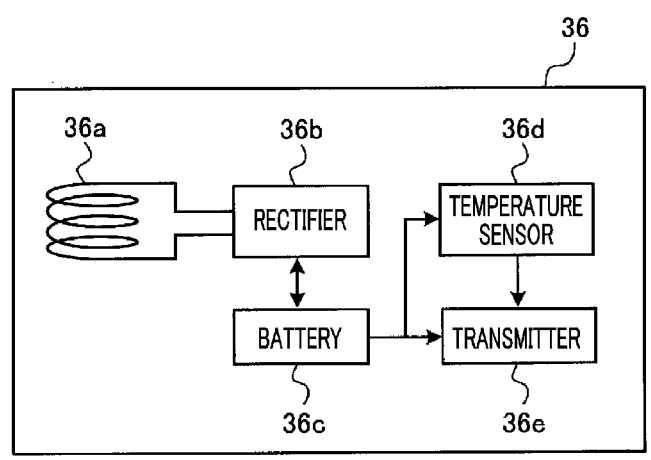
FIG. 8B is a block diagram illustrating a configuration of a wireless temperature sensor according to the fourth modification example of the second exemplary embodiment.

FIG. 8B is a block diagram illustrating a configuration of the wireless temperature sensor 36 according to the fourth modification example of the second exemplary embodiment. As shown in FIG. 8B, the wireless temperature sensor 36 includes a power-receiving coil 36a, a rectifier 36b, a battery 36c, a temperature sensor 36d, and a transmitter 36e.

The power-receiving coil 36a receives the magnetic flux from the coils 32a to 32d, converts this magnetic flux into an AC power, and sends the converted AC power to the rectifier 36b. The rectifier 36b convers the AC power sent from the power-receiving coil 36a into a preset DC power, and sends this DC power to the battery 36c. The battery 36c stores therein the DC power sent from the rectifier 36b. Further, any of various other wireless methods such as a magnetic resonance method, an electric wave propagation method, and so forth may be adopted, regardless of electromagnetic induction wireless charging.

The rectifier 36b, the temperature sensor 36d and the transmitter 36e is operated by the power stored in the battery 36c. The temperature sensor 36d is a sensor equipped with, by way of example, a thermocouple and configured to detect the temperature within the substrate holder 31. The temperature sensor 36d sends the detected temperature information to the transmitter 36e. The transmitter 36e transmits the temperature information received from the temperature sensor 36d to the outside.

With this configuration, the temperature of the substrate holder 31 equipped with the wireless temperature sensor 36 can be monitored. That is, in the fourth modification example, the liquid processing can be performed while estimating the temperature of the wafer W based on the temperature information of the substrate holder 31 which is under monitoring.

Thus, according to the fourth modification example, when the processing ability of the processing liquid is different at the different portions of the wafer W, this processing ability of the processing liquid can be made further uniform within the surface of the wafer W.

<Details of Liquid Processing>

Figure 9:
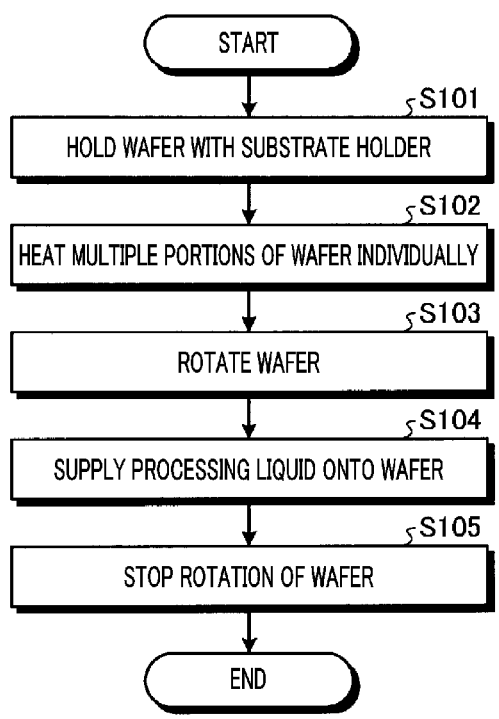
FIG. 9 is a flowchart illustrating a processing sequence in a liquid processing according to the second exemplary embodiment.

Now, referring to FIG. 9, details of the liquid processing according to the second exemplary embodiment will be explained. FIG. 9 is a flowchart illustrating a processing sequence in the liquid processing according to the second exemplary embodiment.

First, a wafer W is taken out of the carrier C and transferred into the liquid processing unit 16 via the substrate transfer device 13, the delivery unit 14 and the substrate transfer device 17.

Then, the controller 18 controls the substrate transfer device 17 and the liquid processing unit 16 to place the wafer W on the substrate holder 31 of the substrate holding mechanism 30, and allows the wafer W to be held by the substrate holder 31 (process S101). For example, this holding processing is carried out as the wafer W is suctioned from the suction opening formed in the top surface of the substrate holder 31.

Subsequently, the controller 18 controls the substrate holding mechanism 30 of the liquid processing unit 16 to heat different portions of the wafer W individually (process S102). By way of example, this heating processing is carried out as an electric current is applied to the respective coils 32a to 32d for a preset time to thereby raise the temperatures of the heating members 31a1 to 31a4 to preset values. By way of example, by setting the electric current application time of the coil 32a to be long, the bevel portion Wa of the wafer W can be heated to a higher temperature.

Then, the controller 18 controls the substrate holding mechanism 30 of the liquid processing unit 16 to rotate the substrate holder 31 at a preset rotation speed, thus allowing the wafer W to be rotated (process S103). Then, the controller 18 controls the processing liquid supply 40 of the liquid processing unit 16 to supply a preset processing liquid onto the wafer W (process S104). Accordingly, the preset liquid processing is performed on the wafer W the different portions of which are controlled to the high temperature.

Finally, the controller 18 controls the substrate holding mechanism 30 of the liquid processing unit 16 to stop the rotation of the substrate holder 31, thus stopping the rotation of the wafer W (process S105). Upon the completion of this stopping processing, the liquid processing of the wafer W is ended.

So far, the various exemplary embodiments of the present disclosure have been described. However, the present disclosure is not limited to the above-described exemplary embodiments, and various changes and modifications may be made without departing from the scope of the present disclosure. By way of example, though the various exemplary embodiments have been described for the example where the wafer W is heated by using the heating members 31a1 to 31a4 of the substrate holder 31, the heating members configured to heat the wafer W may not be limited to being provided in the substrate holder 31.

For example, when performing the liquid processing on the bevel portion Wa of the wafer W, a ring-shaped ceiling plate may be provided above the wafer W. By providing a heating member and a coil at a position of the ring-shaped ceiling plate facing the bevel portion Wa, the bevel portion Wa can be heated from above it.

Further, the wireless temperature sensor 36 is provided in the substrate holding mechanism 30 according to the second exemplary embodiment. However, the wireless temperature sensor 36 may be provided in the substrate holding mechanism 30 according to the first exemplary embodiment. Further, in the second exemplary embodiment, the four sets of the heating members and the coils are provided. However, two or three sets, or more than four sets of heating members and coils may be provided.

Furthermore, in the various exemplary embodiments, the substrate holder 31 is configured to vacuum-chuck the wafer W. However, the substrate holder 31 is not limited to being configured to vacuum-chuck the wafer W but may be configured to chuck the wafer W electrostatically, for example.

In addition, in the various exemplary embodiments, the substrate holder 31 configured to hold the wafer W may be a mechanical chuck configured to hold an edge portion of the wafer W. In this case as well, by disposing the heating member 31 adjacent to the wafer W, the wafer W can be heated efficiently.

The liquid processing apparatus according to the first and second exemplary embodiments is equipped with the heating member 31a, the substrate holder 31, the processing liquid supply 40 and the coil 32a. The heating member 31a is disposed adjacent to a part of the substrate (wafer W) and has the insulating member 31b. The substrate holder 31 is configured to hold the substrate (wafer W). The processing liquid supply 40 is configured to supply the processing liquid onto the substrate (wafer W) held by the substrate holder 31. The coil 32a heats the part of the substrate (wafer W) by heating the heating member 31a inductively. Accordingly, a temperature of the certain part of the wafer W can be controlled individually when the wafer W is liquid-processed.

Further, in the liquid processing apparatus according to the second exemplary embodiment, the multiple heating members 31a1 to 31a4 and the multiple coils 32a to 32d are provided, and these multiple heating members 31a1 to 31a4 and coils 32a to 32d can heat multiple parts of the substrate (wafer W) individually. Accordingly, when a processing ability of the processing liquid is different at the multiple parts of the wafer W, the processing ability of the processing liquid can be made uniform within the surface of the wafer W. Further, the processing ability of the processing liquid within the surface of the wafer W can be varied depending on a part of the wafer W involved.

Moreover, in the liquid processing apparatus according to the second exemplary embodiment, the multiple heating members 31a1 to 31a4 are extended along the circumferential direction of the substrate (wafer W) at the positions facing the substrate (wafer W), and arranged in the diametrical direction of the substrate (wafer W). Accordingly, the processing ability of the processing liquid which is different in the circumferential direction of the wafer W can be made uniform within the surface of the wafer W. Further, the processing ability of the processing liquid within the surface of the wafer W can be varied depending on a part of the wafer W involved.

Additionally, in the liquid processing apparatus according to the second exemplary embodiment, the multiple coils 32a to 32d are extended along the circumferential direction of the substrate (wafer W) at the positions facing the substrate (wafer W), and arranged in the diametrical direction of the substrate (wafer W). Accordingly, the processing ability of the processing liquid which is different in the circumferential direction of the wafer W can be made uniform within the surface of the wafer W. Further, the processing ability of the processing liquid within the surface of the wafer W can be varied depending on a part of the wafer W involved.

Further, in the liquid processing apparatus according to the first and second exemplary embodiments, the insulating member 31b is disposed at the opposite side from the wafer W with the heating member 31a therebetween. Accordingly, a certain part of the wafer W can be heated efficiently when the wafer W is liquid-processed.

Furthermore, the liquid processing apparatus according to the first and second exemplary embodiments is further equipped with the shield member 33 configured to shield the magnetic flux leaking to a place other than the heating member 31a from the coil 32a. Accordingly, the wafer W can be heated more stably when the wafer W is liquid-processed.

In addition, in the liquid processing apparatus according to the fourth modification example, the substrate holder 31 is equipped with the wireless temperature sensor 36 configured to detect a temperature by being operated by a power converted from the magnetic flux radiated from the coils 32a to 32d and transmit the detected temperature information wirelessly. Accordingly, when the processing ability of the processing liquid is different at different parts of the wafer W, the processing ability of this processing liquid can be further uniformed within the surface of the wafer W. Furthermore, the processing ability of the processing liquid within the surface of the wafer W can be varied depending on a part of the wafer W involved.

Moreover, in the liquid processing apparatus according to the first and second exemplary embodiments, the substrate holder 31 is configured to hold the substrate (wafer W) such that the substrate (wafer W) is in direct contact with the substrate holder 31. Accordingly, the wafer W can be more efficiently heated when it is liquid-processed.

Further, in the liquid processing apparatus according to the first and second exemplary embodiments, the heating member 31a is configured as a single body with the substrate holder 31. Accordingly, since the heating member 31a can be disposed adjacent to the wafer W, the wafer W can be more efficiently heated when it is liquid-processed.

Furthermore, the liquid processing method according to the second exemplary embodiment includes the process S101 of holding the substrate (wafer W) by the substrate holder 31 having therein the multiple heating members 31a1 to 31a4 and the insulating member 31b; the process S102 of heating the multiple parts of the substrate (wafer W) by inductively heating the multiple heating members 31a1 to 31a4 with the multiple coils 32a to 32d individually; and the process S104 of supplying the processing liquid onto the heated substrate (wafer W). Accordingly, when the processing ability of the processing liquid is different at the multiple parts of the wafer W, the processing ability of the processing liquid can be uniformed within the surface of the wafer W. Further, the processing ability of the processing liquid within the surface of the wafer W can be varied depending on a part of the wafer W involved.

Additionally, in the liquid processing method according to the second exemplary embodiment, in the process of heating the multiple parts of the substrate, times during which an electric current is applied to the coils 32a to 32d are varied individually. Thus, when the processing ability of the processing liquid is different at the multiple parts of the wafer W, the processing ability of the processing liquid can be uniformed within the surface of the wafer W. Further, the processing ability of the processing liquid within the surface of the wafer W can be varied depending on a part of the wafer W involved.

Further, in the above-described exemplary embodiments, the substrate holder 31 holds a rear surface of the wafer W. However, the substrate holder 31 may not necessarily hold the rear surface of the wafer W but may hold a periphery of the wafer W. In this case, the heating member 31a and the insulating member 31b are provided to be separate from the substrate holder 31. The heating member 31a and the insulating member 31b only needs to be configured as a single body.

Furthermore, the above exemplary embodiments have been described for the example where the substrate holder 31 is rotated during the liquid processing. However, the wafer W need not necessarily be rotated during the liquid processing, and the heating of the wafer W may be performed in the state that the wafer W is stopped.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

EXPLANATION OF CODES

According to the exemplary embodiments, it is possible to control the temperature of the certain part of the wafer individually when the wafer is liquid-processed.

I claim:

1. A liquid processing apparatus, comprising:
a heating member, disposed adjacent to a portion of a substrate, having an insulating member;
a substrate holder configured to hold the substrate;
a processing liquid supply configured to supply a processing liquid onto the substrate held by the substrate holder; and
a coil configured to heat the heating member inductively to heat the portion of the substrate,
wherein the substrate holder comprises a wireless temperature sensor operated by a power converted from a magnetic flux generated by the coil, wherein the wireless temperature sensor is configured to detect a temperature, and to transmit information on the detected temperature wirelessly, wherein the wireless temperature sensor is provided within the heating member.

2. The liquid processing apparatus of claim 1,
wherein the heating member includes multiple heating members and the coil includes multiple coils, and the multiple heating members and the multiple coils are configured to heat multiple portions of the substrate individually.

3. The liquid processing apparatus of claim 2,
wherein the multiple heating members are extended along a circumferential direction of the substrate in an upper portion of the substrate holder, and arranged in a diametrical direction of the substrate.

4. The liquid processing apparatus of claim 2,
wherein the multiple coils are extended along a circumferential direction of the substrate, and arranged in a diametrical direction of the substrate.

5. The liquid processing apparatus of claim 1,
wherein the insulating member is disposed in a lower portion of the substrate holder.

6. The liquid processing apparatus of claim 1, further comprising:
a shield member configured to shield a magnetic flux leaking from the coil to a place other than the heating member.

7. The liquid processing apparatus of claim 1,
wherein the substrate holder holds the substrate such that the substrate is in direct contact with the substrate holder.

8. The liquid processing apparatus of claim 1,
wherein the heating member is configured as a single body with the substrate holder.

9. A substrate processing method, comprising:
providing a liquid processing apparatus according to claim 1;
holding a substrate with the substrate holder;
heating a portion of the held substrate by heating the heating member with the coil; and
supplying a processing liquid onto the heated substrate; and
detecting a temperature of the substrate holder by the wireless temperature sensor and transmitting information on the detected temperature wirelessly.

* * * * *